United States Patent
Park

(10) Patent No.: US 10,609,827 B2
(45) Date of Patent: Mar. 31, 2020

(54) DISPLAY APPARATUS, PORTABLE TERMINAL, AND OPERATING METHOD OF DISPLAY APPARATUS

(71) Applicant: Samsung Display Co., Ltd., Yongin-si, Gyeonggi-do (KR)

(72) Inventor: Sungun Park, Suwon-si (KR)

(73) Assignee: Samsung Display Co., Ltd., Yongin-si (KR)

(*) Notice: Subject to any disclaimer, the term of this patent is extended or adjusted under 35 U.S.C. 154(b) by 449 days.

(21) Appl. No.: 15/346,481

(22) Filed: Nov. 8, 2016

(65) Prior Publication Data
US 2017/0332494 A1    Nov. 16, 2017

(30) Foreign Application Priority Data
May 10, 2016   (KR) .......................... 10-2016-0057179

(51) Int. Cl.
*H05K 5/00* (2006.01)
*H04M 1/18* (2006.01)
(Continued)

(52) U.S. Cl.
CPC ........ H05K 5/0017 (2013.01); G01P 15/0891 (2013.01); H01F 1/047 (2013.01);
(Continued)

(58) Field of Classification Search
CPC ...... G01P 15/0891; H01F 1/047; H01F 7/064; H05K 1/18; H05K 7/14;
(Continued)

(56) References Cited

U.S. PATENT DOCUMENTS 3,089,064 A * 5/1963 De Bennetot .............. B41J 9/38
                                                    192/18 B
7,350,394 B1 * 4/2008 Flynn .................. G01P 15/0891
                                                    73/1.38
(Continued)

FOREIGN PATENT DOCUMENTS

CN      105070761 A      11/2015
JP    2005246634 A  *   9/2005
(Continued)

OTHER PUBLICATIONS

Machine Translation of Tomita et al. Japanese Patent Document JP 2005-246634 A Sep. 2005 (Year: 2005).*

*Primary Examiner* — Kevin J Comber
(74) *Attorney, Agent, or Firm* — Lewis Rocca Rothgerber Christie LLP

(57) ABSTRACT

A display apparatus includes: a display module including a display panel, a window member on the display panel and having an area greater than an area of the display panel, and a magnetic member attached to at least one of the display panel and the window member; a set bracket under the display module; and an electro permanent magnet fixed to the set bracket. The electro permanent magnet is coupled to the display module in a first mode and decoupled from the display module in a second mode. The display apparatus is configured to enter the second mode from the first mode if an impact equal to or greater than a reference value is applied or is to be applied after a period of time.

25 Claims, 13 Drawing Sheets

(51) Int. Cl.
*H04M 1/02* (2006.01)
*G01P 15/08* (2006.01)
*H01F 1/047* (2006.01)
*H01F 7/06* (2006.01)
*H05K 1/18* (2006.01)
*H05K 7/14* (2006.01)

(52) U.S. Cl.
CPC .......... *H01F 7/064* (2013.01); *H04M 1/0266* (2013.01); *H04M 1/185* (2013.01); *H05K 1/18* (2013.01); *H05K 7/14* (2013.01); *H04M 2250/12* (2013.01); *H05K 2201/10151* (2013.01)

(58) Field of Classification Search
CPC ...... H05K 2201/10151; H05K 5/0017; H04M 1/0266; H04M 1/185; H04M 2250/12
USPC .......................................... 361/170
See application file for complete search history.

(56) References Cited

U.S. PATENT DOCUMENTS

| | | |
|---|---|---|
| 8,546,180 B2 | 10/2013 | Yamazaki et al. |
| 2010/0061040 A1* | 3/2010 | Dabov .................. G06F 1/1626 361/679.01 |
| 2010/0231337 A1 | 9/2010 | Chang et al. |
| 2013/0010223 A1* | 1/2013 | Lim .................. G02F 1/133308 349/58 |
| 2013/0343012 A1 | 12/2013 | Park |
| 2017/0180522 A1* | 6/2017 | Wilson ............... H04M 1/0249 |

FOREIGN PATENT DOCUMENTS

| | | |
|---|---|---|
| KR | 2005-0087953 A | 9/2005 |
| KR | 10-2006-0098984 A | 9/2006 |
| KR | 2012-0126767 A | 11/2012 |
| KR | 10-2014-0002102 A | 1/2014 |

* cited by examiner

DISPLAY APPARATUS, PORTABLE TERMINAL, AND OPERATING METHOD OF DISPLAY APPARATUS

CROSS-REFERENCE TO RELATED APPLICATION

This patent application claims priority to and the benefit of Korean Patent Application No. 10-2016-0057179, filed on May 10, 2016 in the Korean Intellectual Property Office, the entire content of which is hereby incorporated by reference.

BACKGROUND

Aspects of embodiments of the present disclosure relate to a display apparatus, a portable terminal, and an operating method of the display apparatus.

A display apparatus may be embodied in the form of a portable terminal, a TV, a monitor, or the like or may be adopted in various electronic appliances.

In general, the portable terminal is not fixedly installed for use, but is often used by a user who is moving. Thus, there may frequently occur incidents in which the portable terminal falls on the ground to be impacted or in which the portable terminal is impacted by a specific object from the outside thereof.

The portable terminal includes a window member constituting (or forming) an exterior appearance thereof. If an impact occurs to the portable terminal, the window member, which is vulnerable to the impact, may be damaged.

SUMMARY

Aspects of embodiments of the present disclosure provide a display apparatus capable of reducing the effects of or preventing damage due to an external impact, a portable terminal, and an operating method of the display apparatus.

A display apparatus according to an embodiment of the inventive concept includes: a display module, a set bracket; and an electro permanent magnet.

In an embodiment, the display module may include a display panel, a window member on the display panel and having an area greater than an area of the display panel, and a magnetic member attached to at least one of the display panel and the window member.

In an embodiment, the set bracket may be under the display module.

In an embodiment, the electro permanent magnet may be fixed to the set bracket, and may be configured to be coupled to the display module in a first mode and to be decoupled from the display module in a second mode.

In an embodiment, the display apparatus may enter the second mode from the first mode if an impact equal to or greater than a reference value is applied to the display apparatus or is to be applied to the display apparatus after a period of time.

In an embodiment, the electro permanent magnet may include a first magnetic member, a second magnetic member, a first permanent magnet, a second permanent magnet, and a solenoid. The second magnetic member may be spaced from the first magnetic member. The first permanent magnet may contact the first and second magnetic members. The second permanent magnet may contact the first and second magnetic members and may be spaced from the first permanent magnet. The solenoid may surround the first permanent magnet.

In an embodiment, each of the first and second magnetic members may include Hiperco®. The first permanent magnet may include an aluminum-nickel-cobalt (AlNiCo) magnet. The second permanent magnet may include a neodymium (NdFeB) magnet.

In an embodiment, the display apparatus may further include a main printed circuit substrate on a rear surface of the set bracket. The main printed circuit substrate may apply a first current to the solenoid in the first mode and may apply a second current having a different direction from the first current to the solenoid in the second mode.

In an embodiment, the main printed circuit substrate may include an acceleration sensor configured to calculate the impact which is applied to the display apparatus based on acceleration or which is to be applied to the display apparatus after a period of time.

In an embodiment, the window member may include an effective portion overlapping the display panel and a peripheral portion not overlapping (e.g., adjacent to) the display panel. The magnetic member may be on a rear surface of the peripheral portion. The electro permanent magnet may overlap the peripheral portion and may be between the magnetic member and the set bracket.

In an embodiment, the effective portion may have a rectangular shape when viewed in a plane. The peripheral portion may surround the effective portion when viewed in the plane. The magnetic member may be between an outer border of the peripheral portion facing a short side of the effective portion and the short side of the effective portion.

In an embodiment, the first and second magnetic members may be attached to the magnetic member in the first mode, and the first and second magnetic members may be decoupled from the magnetic member in the second mode.

In an embodiment, the display module may further include a first alignment member on the rear surface of the peripheral portion and spaced from the magnetic member; and a second alignment member arranged with the first alignment member in the first mode.

In an embodiment, the magnetic member may be on a rear surface of the display panel. The electro permanent magnet may be between the magnetic member and the set bracket.

In an embodiment, the window member may include an effective portion overlapping the display panel and a peripheral portion not overlapping (e.g., adjacent to or offset from) the display panel. The magnetic member may include a side magnetic member on a side surface of the display panel and a rear magnetic member on the rear surface of the display panel. The electro permanent magnet may overlap the peripheral portion and may be between the side magnetic member and the set bracket.

In an embodiment, the side magnetic member and the rear magnetic member may be integrally formed.

A portable terminal according to an embodiment of the inventive concept includes a display module and a set module. The display module may include a display panel, a window member on the display panel and having an area greater than an area of the display panel, and a magnetic member attached to at least one of the display panel and the window member.

In an embodiment, the set module may be coupled to the display module in a first mode and decoupled from the display module in a second mode.

In an embodiment, the set module may include a set bracket, an electro permanent magnet, and a main printed circuit substrate. The set bracket may be on a lower portion of the display module. The electro permanent magnet may be coupled to the magnetic member in the first mode and decoupled from the magnetic member in the second mode. The main printed circuit substrate may be on a rear surface of the set bracket and electrically connected to the display module.

In an embodiment, the portable terminal may enter the second mode from the first mode if an impact equal to or greater than a reference value is applied to the portable terminal or to be applied to the portable terminal after a period of time.

A method of operating a display apparatus according to an embodiment of the inventive concept includes calculating an impact applied to a display apparatus and determining whether or not the impact applied to the display apparatus is equal to or greater than a reference value.

In an embodiment, if the impact applied to the display apparatus is equal to or greater than a reference value, the display apparatus may operate in a second mode in which the display module and the set module are decoupled from each other.

In an embodiment, if the impact applied to the display apparatus is less than the reference value, the display apparatus may operate in a first mode in which the display module and the set module are coupled to each other.

A method of operating a display apparatus according to an embodiment of the inventive concept includes calculating acceleration of movement of a display apparatus, determining whether or not the acceleration of the movement of the display apparatus is equal to or less than a reference value, and determining whether or not a period of time has elapsed when a difference between the acceleration of the movement and an acceleration of gravity of the display apparatus is equal to or less then the reference value.

In an embodiment, if the difference between the acceleration of the movement and the acceleration of gravity of the display apparatus has been equal to or less than the reference value for the period of time, the display apparatus may operate in a second mode in which the display module and the set module are decoupled from each other.

In an embodiment, when the difference between the acceleration of the movement and the acceleration of gravity is greater than the reference value, or if the difference between the acceleration of the movement and the acceleration of gravity of the display apparatus has been equal to or less than the reference value for less than the period of time, the display apparatus may operate in a first mode in which the display module and the set module are coupled to each other.

BRIEF DESCRIPTION OF THE DRAWINGS

The accompanying drawings are included to provide a further understanding of the inventive concept and are incorporated in and constitute a part of this specification. The drawings illustrate exemplary embodiments of the inventive concept and, together with the description, serve to explain aspects and features of the inventive concept. In the drawings.

DETAILED DESCRIPTION

Figure 1:
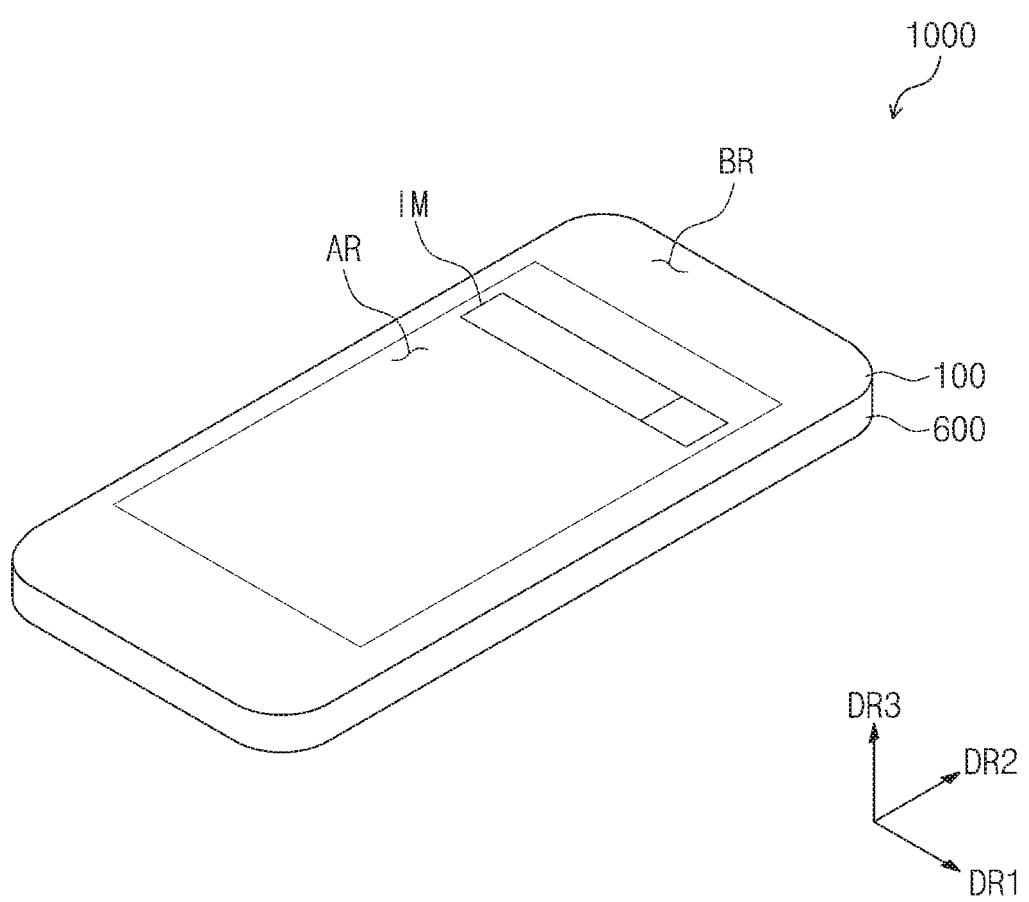
FIG. 1 is a perspective view of a display apparatus according to an embodiment of the inventive concept.

Embodiments described herein according to the inventive concept may be variously modified and may have multiple forms, and thus, while certain embodiments are illustrated in the drawings and/or are described, in detail, in this specification, the inventive concept is not intended to be limited by these embodiments. Rather, it should be understood that all variations, equivalents, and/or substitutes contained in the concept and technical scope of the present invention are also included. Also, in the drawings, descriptions of elements not related to the inventive concept may be omitted for clarity.

Hereinafter, exemplary embodiments of the inventive concept will be described, in detail, with reference to the accompanying drawings.

It will be understood that when an element is referred to as being "on," "connected to," or "coupled to" another element, it may be directly on, connected, or coupled to the other element or one or more intervening elements may also be present. When an element is referred to as being "directly on," "directly connected to," or "directly coupled to" another element, there are no intervening elements present. For example, when a first element is described as being "coupled" or "connected" to a second element, the first element may be directly coupled or connected to the second element or the first element may be indirectly coupled or connected to the second element via one or more intervening elements. The same reference numerals designate the same elements. As used herein, the term "and/or" includes any and all combinations of one or more of the associated listed items. Further, the use of "may" when describing embodiments of the present invention relates to "one or more embodiments of the present invention." Expressions, such as "at least one of," when preceding a list of elements, modify the entire list of elements and do not modify the individual elements of the list. Also, the term "exemplary" is intended to refer to an example or illustration. As used herein, the terms "use," "using," and "used" may be considered synonymous with the terms "utilize," "utilizing," and "utilized," respectively.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments. In the figures, dimensions of the various elements, layers, etc. may be exaggerated for clarity of illustration.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The terminology used herein is for the purpose of describing particular example embodiments of the present invention and is not intended to be limiting of the described example embodiments of the present invention. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

The communication processor, the image processor, the acceleration sensor, the gyro sensor, the voltage generation circuit and/or any other relevant devices or components according to embodiments of the present invention described herein may be implemented utilizing any suitable hardware, firmware (e.g., an application-specific integrated circuit), software, and/or a suitable combination of software, firmware, and hardware. For example, the various components of the communication processor, the image processor, the acceleration sensor, the gyro sensor, and/or the voltage generation circuit may be formed on one integrated circuit (IC) chip or on separate IC chips. Further, the various components of the communication processor, the image processor, the acceleration sensor, the gyro sensor, and/or the voltage generation circuit may be implemented on a flexible printed circuit film, a tape carrier package (TCP), a printed circuit board (PCB), or formed on a same substrate as the communication processor, the image processor, the acceleration sensor, the gyro sensor, and/or the voltage generation circuit. Further, the various components of the communication processor, the image processor, the acceleration sensor, the gyro sensor, and/or the voltage generation circuit may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device or the functionality of a particular computing device may be distributed across one or more other computing devices without departing from the scope of the exemplary embodiments of the present invention.

Figure 2:
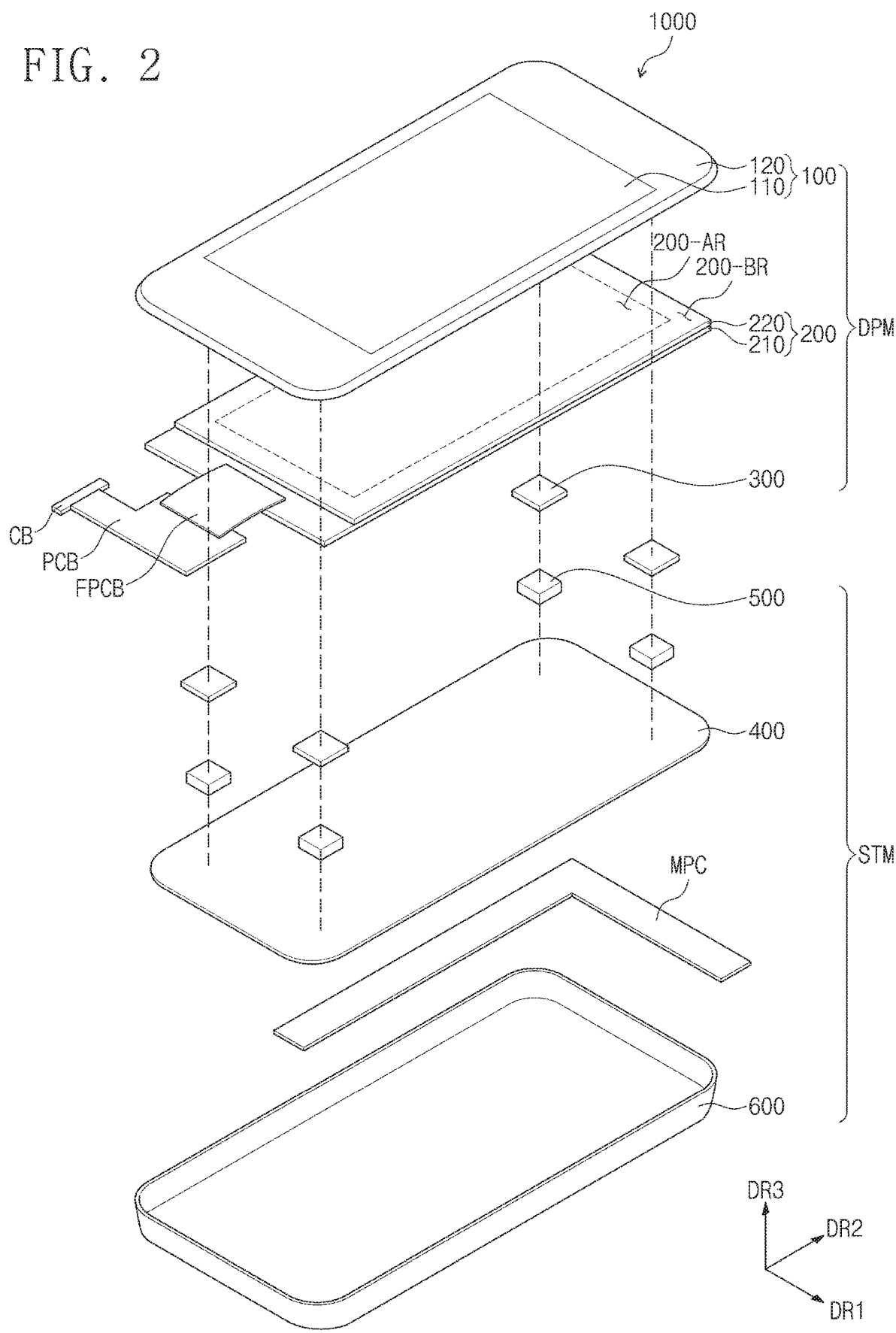
FIG. 2 is an exploded perspective view of the display apparatus shown in FIG. 1.

FIG. 1 is a perspective view of a display apparatus according to an embodiment of the inventive concept, and FIG. 2 is an exploded perspective view of the display apparatus shown in FIG. 1.

In FIG. 1, a portable terminal is illustrated as an example to which the display apparatus according to an embodiment of the inventive concept is applied. The portable terminal may include a tablet PC, a smart phone, a portable digital assistant (PDA), a portable multimedia player (PMP), a game device, a wrist type electronic device, or the like, but the inventive concept is not limited thereto. The display apparatus according to embodiments of the inventive concept may be used in large electronic apparatuses, such as an outdoor advertisement board, as well as in mid- and small-size electronic apparatuses, such as a personal computer, a laptop computer, a car navigation unit, and a camera. The above-mentioned electronic apparatuses are presented as example embodiments only, and it is apparent that the display apparatus according to embodiments of the inventive concept may be adopted in other electronic apparatuses without departing from the inventive concept.

As illustrated in FIG. 1, a display apparatus 1000 includes a plurality of areas identified on a display surface. For example, the display apparatus 1000 includes a display area AR in which an image IM is displayed and a non-display area BR adjacent to the display area AR. In FIG. 1, an internet search window is illustrated as an example of the image IM. For example, the display area AR may be a quadrangular shape. The non-display area BR surrounds the display area AR (e.g., surrounds a periphery of the display area AR).

Referring to FIGS. 1 and 2, the display apparatus 1000 may include a display module DPM and a set module STM. The set module STM includes a set bracket 400, a main printed circuit substrate MPC, an electro permanent magnet 500 (EPM), and a rear case 600.

The display module DPM may include a window member 100, a display panel 200, and a magnetic member 300 (e.g., a magnet).

The window member 100 may be disposed on (e.g., over) the display panel 200. The window member 100 may have an area greater than an area of the display panel 200. The window member 100 may include an effective portion 110 overlapping the display panel 200 and a peripheral portion 120 not overlapping the display panel 200. The window member 100 may be made of glass, sapphire, plastic, or the like.

In the display panel 200, a display area 200-AR and a non-display area 200-BR are defined. The display area 200-AR is an area displaying the image IM and may be substantially the same area as the display area AR. The non-display area 200-BR is adjacent to the display area 200-AR and may be included in the non-display area BR.

The display panel 200 may be an organic light emitting display panel. The display panel 200 may include a substrate 210, an organic light emitting device, and a sealing layer 220. The organic light emitting device is disposed on the substrate 210. The sealing layer 220 is disposed on the substrate 210 and seals the organic light emitting device from the outside.

The display panel 200 may have a display surface displaying the image IM and a rear surface opposed to (opposite to) the display surface. In FIG. 2, the display surface is defined as an upper surface of the sealing layer 220, and the rear surface is defined as a lower surface of the substrate 210.

The display surface on which the image IM is displayed is parallel to a plane defined by a first direction DR1 and a second direction DR2, and a direction perpendicular to (or normal to) the display surface is indicated by a third direction DR3. The third direction DR3 is a reference direction differentiating between front surfaces and rear surfaces of respective components or members. However, these directions are a relative concept and may correspond to different directions according to, for example, different orientations of the display apparatus 1000.

The magnetic member 300 may be attached to at least one of the window member 100 and the display panel 200. One or more of the magnetic members 300 may be provided. A more detailed description of the magnetic member 300 will be provided later.

The display module DPM may further include a flexible printed circuit substrate FPCB and a printed circuit substrate PCB.

The flexible printed circuit substrate FPCB electrically connects the display panel 200 to the printed circuit substrate PCB. One end of the flexible printed circuit substrate FPCB is connected to one surface of (e.g., a portion of one surface of) the substrate 210 which is exposed by the sealing layer 220, and the other end thereof may be connected to the printed circuit substrate PCB. The flexible circuit substrate FPCB is flexibly provided to be bent toward a lower portion of (e.g., a lower surface of) the substrate 210 in a coupled state.

The printed circuit substrate PCB may output a signal to the display panel 200 though the flexible printed circuit substrate FPCB and/or may receive a signal from the display panel 200. Because the flexible printed circuit substrate FPCB is flexible (e.g., may be bent), the printed circuit substrate PCB may be attached to the lower portion of (e.g., the lower surface of) the substrate 210 in a coupled state. A connector CB for receiving a signal from the outside may be connected to the printed circuit substrate PCB.

The display module DPM may further include a touch panel. The touch panel may be disposed between the window member 100 and the display panel 200 but is not limited thereto. The touch panel may be disposed inside (e.g., may be integral with) the display panel 200 according to some embodiments. The touch panel may be a resistive type, a capacitive type, or an electromagnetic induction type touch panel and may obtain coordinate information of a point where a touch event occurred.

The display module DPM may further include a cover panel attached to the rear surface of the display panel 200. The cover panel may emit heat (e.g., may serve to emit heat) generated by the display panel 200 and may shield electromagnetic interference between (e.g., generated between) the display panel 200 and the printed circuit substrate PCB.

The set bracket 400 may be coupled to the rear surface of the display panel 200. A space for receiving (or accommodating) the electro permanent magnet 500 may be provided on one surface of the set bracket 400, and the main printed circuit substrate MPC may be disposed on a rear surface of the set bracket 400.

The main printed circuit substrate MPC is electrically connected to the printed circuit substrate PCB through the connector CB. The main printed circuit substrate MPC may provide various signals, including image data, to the printed circuit substrate PCB. On the main printed circuit substrate MPC, a CPU, a memory, a communication processor, an image processor, an acceleration sensor, a gyro sensor, and/or a voltage generation circuit may be mounted.

The acceleration sensor may sense an acceleration of the display apparatus 1000. Also, the acceleration sensor may calculate an impact which is applied or is to be applied after a period of time (e.g., after a predetermined time) on the basis of the acceleration of the display apparatus 1000.

The electro permanent magnet 500 may be fixed to the set bracket 400. The electro permanent magnet 500 may be coupled to and decoupled from (e.g., may be selectively coupled to and decoupled from) the display module DPM according to a signal applied from the main printed circuit substrate MPC. The electro permanent magnet 500 may generate attraction or repulsion for the magnetic member 300 (e.g., the electro permanent magnet 500 may generate or selectively generate an attractive force or a repulsive force with the magnetic member 300). A more detailed description of the electro permanent magnet 500 will be provided later.

The rear case 600 is coupled to the window member 100 so as to accommodate the display module DPM, the set bracket 400, the main printed circuit substrate MPC, and the electro permanent magnet 500. The rear case 600 may include plastic or metal. In an embodiment, the rear case 600 may be omitted.

The display apparatus 1000 may operate in any one of a first mode or a second mode. The display module DPM and the set module STM are coupled to each other in the first mode (e.g., when the display apparatus 1000 is operating in the first mode). The display module DPM and the set module STM may be decoupled from each other in the second mode (e.g., when the display apparatus 1000 is operating in the second mode). A more detailed description of the first mode and the second mode will be provided later.

Figure 3:
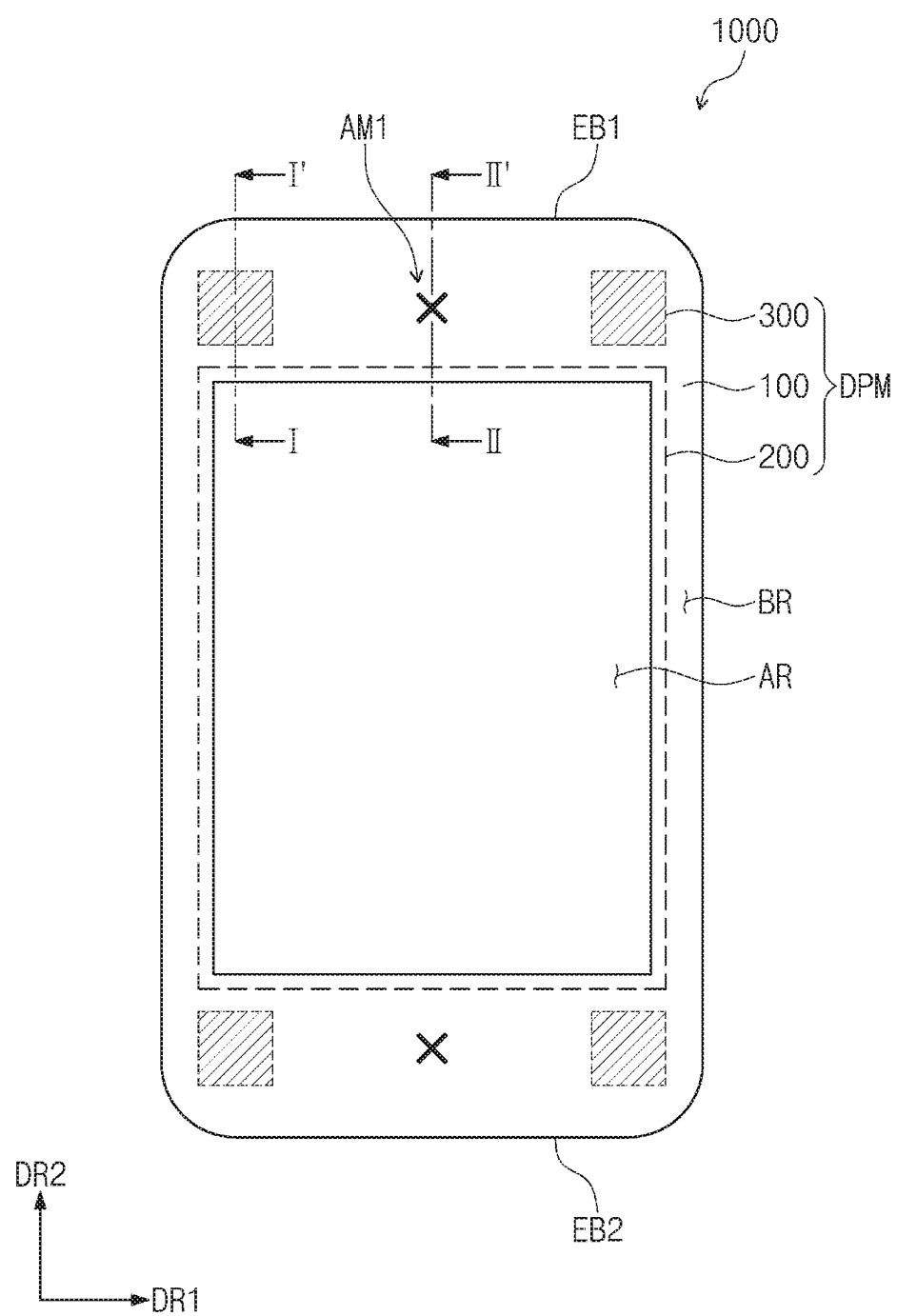
FIG. 3 is a plane view illustrating a display apparatus according to an embodiment of the inventive concept.
Figure 4:
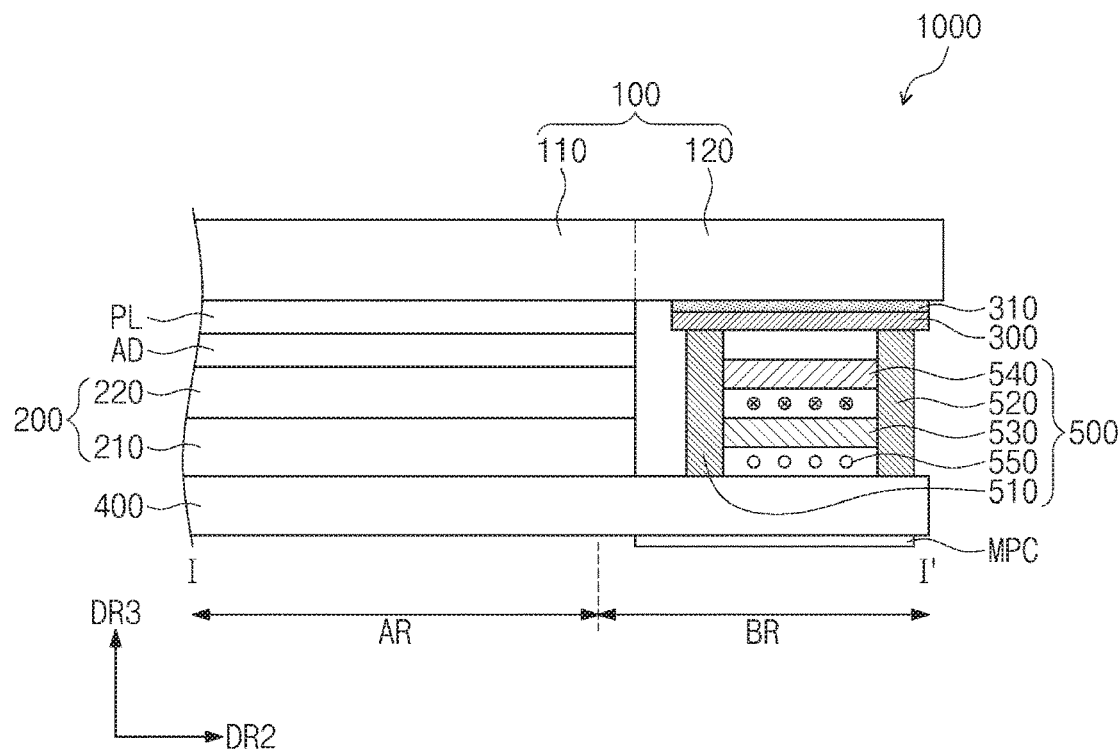
FIG. 4 is a cross-sectional view taken along the line I-I' of FIG. 3 while the display apparatus operates in a first mode.

FIG. 3 is a plane view illustrating a display apparatus according to an embodiment of the inventive concept, and FIG. 4 is a cross-sectional view taken along the line I-I' of FIG. 3 while the display apparatus operates in the first mode.

A structure of the display apparatus operating in the first mode will now be further described with reference to FIGS. 3 and 4.

In FIG. 3, a display module DPM including a window member 100, a display panel 200, and a magnetic member 300 is illustrated.

The display panel 200 may have a rectangular shape when viewed in a plane. Thus, an effective portion 110 of the window member 100 may have the rectangular shape.

The magnetic member 300 may be disposed to overlap (e.g., may be disposed on) a peripheral portion 120 of the window member 100. The magnetic member 300 may be disposed between outer boundaries EB1 and EB2 of the peripheral portion 120 facing short sides of the effective portion 110 and the short sides of the effective portion 110. The magnetic member 300 may be provided in plurality (e.g., a plurality of the magnetic members 300 may be provided), and the magnetic members 300 may be disposed so as to be adjacent to at least two or more corners from among four corners of the effective portion 110. In FIG. 3, it is exemplarily illustrated that four of the magnetic members 300 are provided and are respectively disposed to be adjacent to the four corners of the effective portion 110.

The magnetic member 300 may be disposed on a rear surface of the peripheral portion 120. The display module DPM may further include an adhesive layer 310 disposed between the magnetic member 300 and the peripheral portion 120. The adhesive layer 310 may include an optical clear adhesive (OCA), an optical clear resin, or other suitable materials having adhesion. The magnetic member 300 may include Hiperco®. Hiperco® is a registered trademark of CRS Holdings, Inc., Wilmington, Del. Hiperco® may be a magnetic metal alloy, a cobalt-iron soft magnetic alloy, or an iron-cobalt-vanadium soft magnetic alloy.

An electro permanent magnet 500 may be disposed to face the magnetic member 300. The electro permanent magnet 500 may be disposed to overlap the peripheral portion 120. The electro permanent magnet 500 may be coupled to (e.g., attached to or magnetically adhered to) the magnetic member 300 in the first mode.

The electro permanent magnet 500 may be attached to the set bracket 400. For example, the electro permanent magnet 500 may be attached to the set bracket 400 by an adhesive and may be inserted in a groove provided in the set bracket 400 to be physically coupled thereto.

The electro permanent magnet 500 may include a first magnetic member 510, a second magnetic member 520, a first permanent magnet 530, a second permanent magnet 540, and a solenoid 550.

The first magnetic member 510 and the second magnetic member 520 may be spaced from each other in a direction parallel to a plane formed by a first direction DR1 and a second direction DR2. The first and second magnetic members 510 and 520 may extend in (e.g., may have long shapes extending in) a third direction DR3. The first and second magnetic members 510 and 520 may be attached to the magnetic member 300 in the first mode.

The first and second magnetic members 510 and 520 may include Hiperco®.

Each of the first and second permanent magnets 530 and 540 may contact the first and second magnetic members 510 and 520. The first and second permanent magnets 530 and 540 may be spaced from each other in the third direction DR3.

The first permanent magnet 530 may change its magnetization direction according to a direction of current flowing in the solenoid 550. The magnetization direction of the first permanent magnet 530 in the first mode and the magnetization direction of the first permanent magnet 530 in the second mode may be different from (e.g., opposite to) each other.

The magnetization direction of the second permanent magnet 540 may be constant.

The first permanent magnet 530 may include an AlNiCo (aluminum-nickel-cobalt) magnet. The second permanent magnet 540 may include a neodymium (NdFeB) magnet.

The solenoid 550 may surround (e.g., may surround upper and lower surfaces of) the first permanent magnet 530. In FIG. 4, portions of the solenoid 550 moving into the figure are indicated by '⊗' and other portions of the solenoid 550 moving out from the figure are indicated by '○'.

The solenoid 550 may be electrically connected to the main printed circuit substrate MPC. The main printed circuit substrate MPC may apply a first current to the solenoid 550 in the first mode. The main printed circuit substrate MPC may apply a second current having different direction from the first current to the solenoid 550 in the second mode.

The rear surface of the display panel 200 may not be bonded to the set bracket 400. For example, a lower surface of the substrate 210 is not bonded to the set bracket 400.

The display module DPM may further include a polarizing plate PL and an adhesive layer AD. The polarizing plate PL may circularly polarize incident light. The adhesive layer AD may bond the sealing layer 220 and the polarizing plate PL to each other.

The display apparatus 1000 may further include a cushion layer disposed between the substrate 210 and the set bracket 400. The cushion layer prevents the display module DPM from being damaged or reduces damage to the display module DPM due to an external impact.

Figure 5:
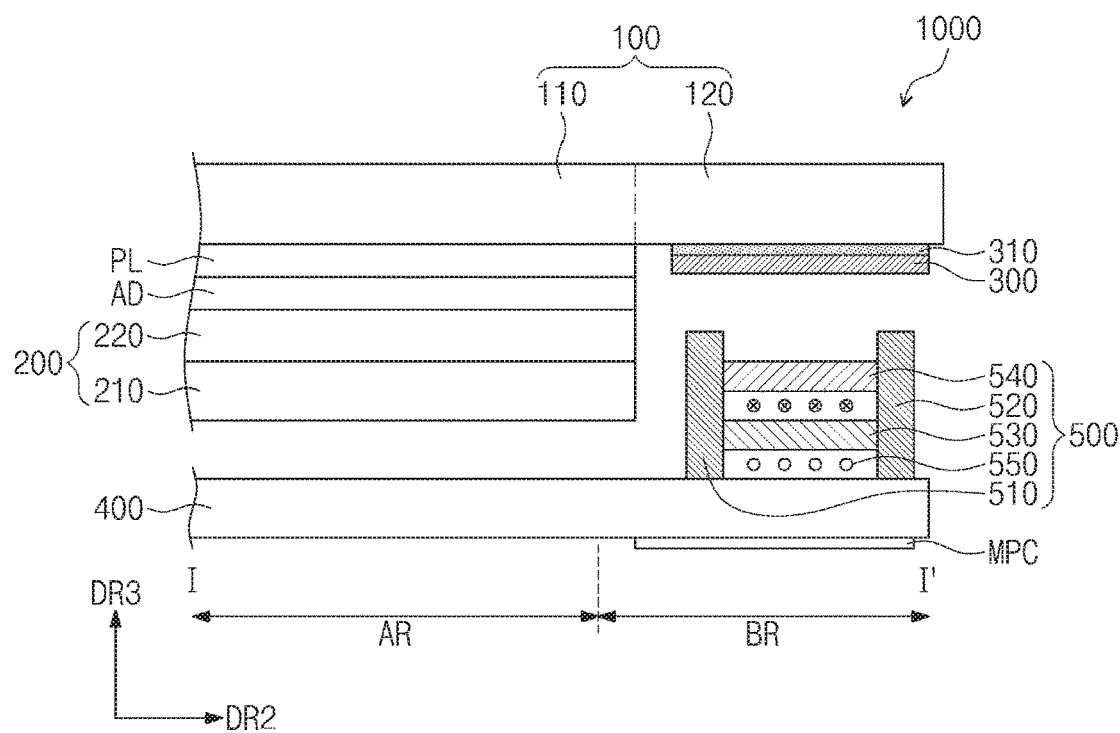
FIG. 5 a cross-sectional view taken along the line I-I' of FIG. 3 while the display apparatus operates in a second mode.

FIG. 5 a cross-sectional view taken along the line I-I' of FIG. 3 while the display apparatus operates in the second mode.

Referring to FIG. 5, the display module DPM and the electro permanent magnet 500 may be separated from each other in the second mode. The display module DPM and the set bracket 400 may be easily decoupled from each other because the display module DPM is not attached to (e.g., is not permanently or fixedly attached to) the set bracket 400 when no binding force occurs between the magnetic member 300 and the electro permanent magnet 500.

If the display apparatus 1000 falls on and collides with the ground, or if an external impact is applied thereto, the impact is proportional to the weight of the display apparatus 1000. The weight of the display module DPM relative to the total weight of the display apparatus 1000 is relatively small. However, the display module DPM has a configuration which is relatively easily damaged if the external impact is applied to the display apparatus 1000.

The display apparatus 1000 according to an embodiment of the inventive concept operates in the first mode in an ordinary state. If an impact greater than a reference value (e.g., a predetermined value) is applied or is expected or determined to be applied to the display apparatus 1000 from the outside, the display apparatus 1000 enters the second mode from the first mode to reduce the impact applied to the display module DPM and may thus prevent the display module DPM from being damaged or may reduce damage to the display module DPM.

If an impact greater than the reference value is applied or is expected or determined to be applied after a period of time (e.g., a predetermined time) to the display apparatus 1000, the main printed circuit substrate MPC may change the direction of the current applied to the solenoid 550.

Figure 6:
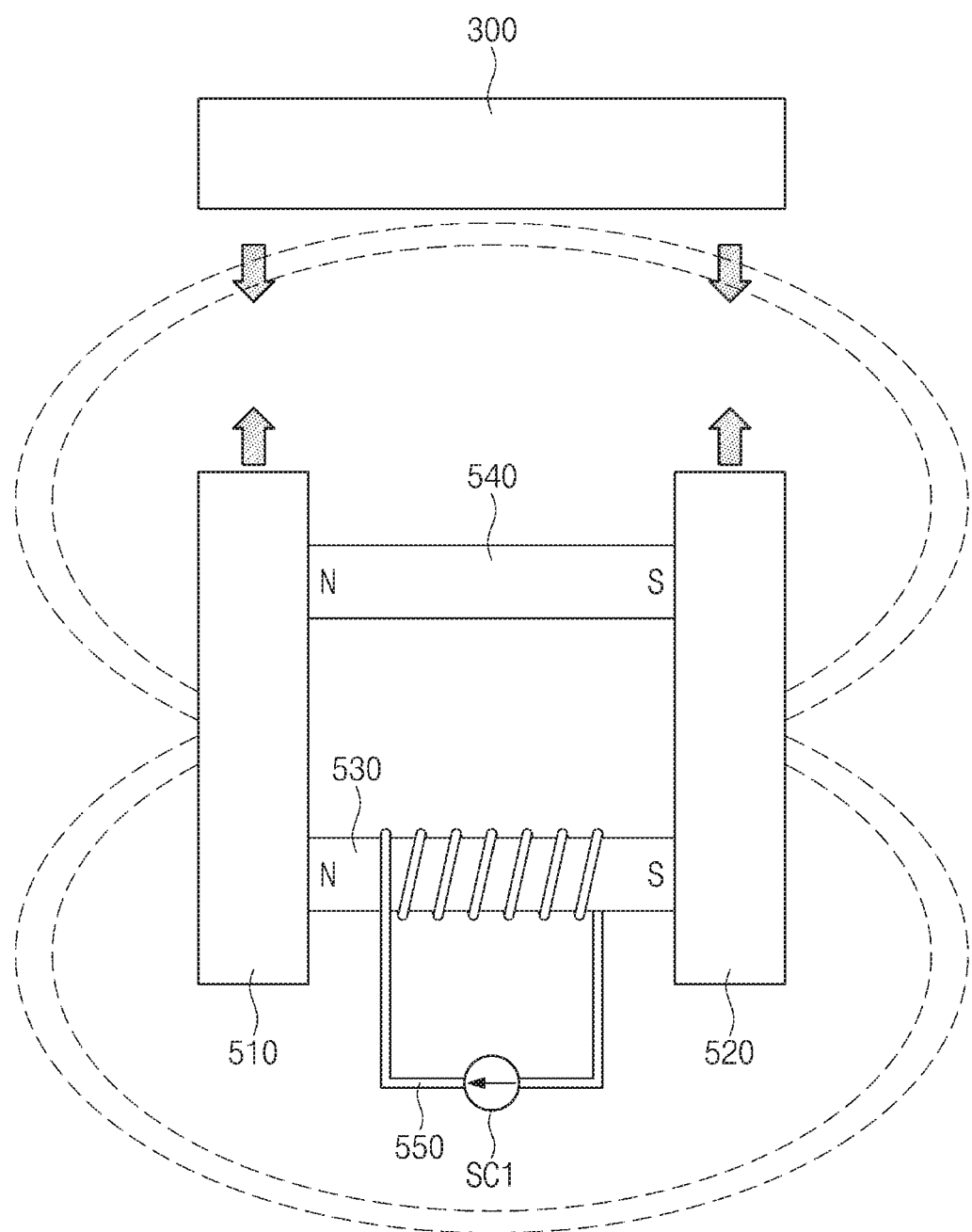
FIG. 6 is an illustration of a coupling mechanism of an electro permanent magnet and a magnetic member in the display apparatus operating in the first mode according to an embodiment of the inventive concept.
Figure 7:
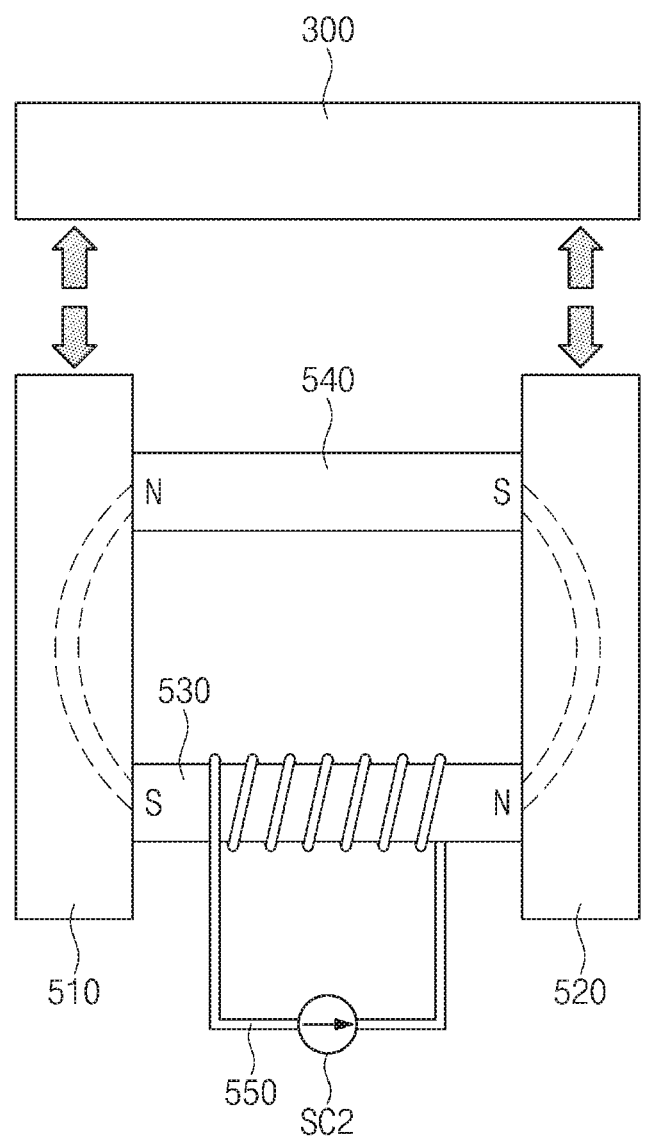
FIG. 7 is an illustration of a separation mechanism of the electro permanent magnet and the magnetic member in the display apparatus operating in the second mode according to an embodiment of the inventive concept.

FIG. 6 is an illustration of a coupling mechanism of an electro permanent magnet and a magnetic member of the display apparatus in the first mode according to an embodiment of the inventive concept, and FIG. 7 is an illustration of a separation mechanism of the electro permanent magnet and the magnetic member of the display apparatus in the second mode according to an embodiment of the inventive concept.

Polarity of the second permanent magnet 540 is constantly (or consistently) maintained (e.g., the polarity of the second permanent magnet 540 is the same in both the first and second modes). In FIGS. 6 and 7, it is illustrated that the N pole of the solenoid 550 is on the left and the S pole thereof is on the right.

Referring to FIG. 6, the first current flows through the solenoid 550 in the first mode. In FIG. 6, it is illustrated that the solenoid 550 is connected to the first current source SC1 which supplies the first current.

Polarity of the first permanent magnet 530 is determined by the first current flowing through the solenoid 550. In FIG. 6, it is illustrated that the N pole of the first permanent magnet 530 is on the left and the S pole thereof is on the right. The first magnetic member 510 is connected to the N poles of the first and second permanent magnets 530 and 540 to be magnetized to the N pole. The second magnetic member 520 is connected to the S poles of the first and second permanent magnets 530 and 540 to be magnetized to the S pole. The first and second magnetic members 510 and 520 and the first and second permanent magnets 530 and 540 form, as a whole, a large magnet.

A magnetic flux line is not formed inside (or between) the first and second magnetic members 510 and 520 but is formed in the air (e.g., is formed around the first and second magnetic members 510 and 520). Thus, in the first mode, magnetic attraction is generated between the first magnetic member 510 and the magnetic member 300 and between the second magnetic member 520 and the magnetic member 300.

Referring to FIG. 7, the second current flows through the solenoid 550 in the second mode. The second current may flow in a different direction from (e.g., an opposite direction from) that of the first current. In FIG. 7, it is exemplarily illustrated that the solenoid 550 is connected to a second current source SC2 which supplies the second current.

The polarity of the first permanent magnet 530 may be switched according to the direction of the current flowing through the solenoid 550. In FIG. 7, it is illustrated that the N pole of the first permanent magnet 530 is on the right and the S pole thereof is on the left. The first and second magnetic members 510 and 520 have a much greater magnetic permeability in comparison to the air, and thus, the magnetic flux line formed by the first and second permanent magnets 530 and 540 is formed inside (e.g., between) the first and second magnetic members 510 and 520. Thus, in the second mode, magnetic attraction is not generated between the first magnetic member 510 and the magnetic member 300 or between the second magnetic member 520 and the magnetic member 300.

Figure 8:
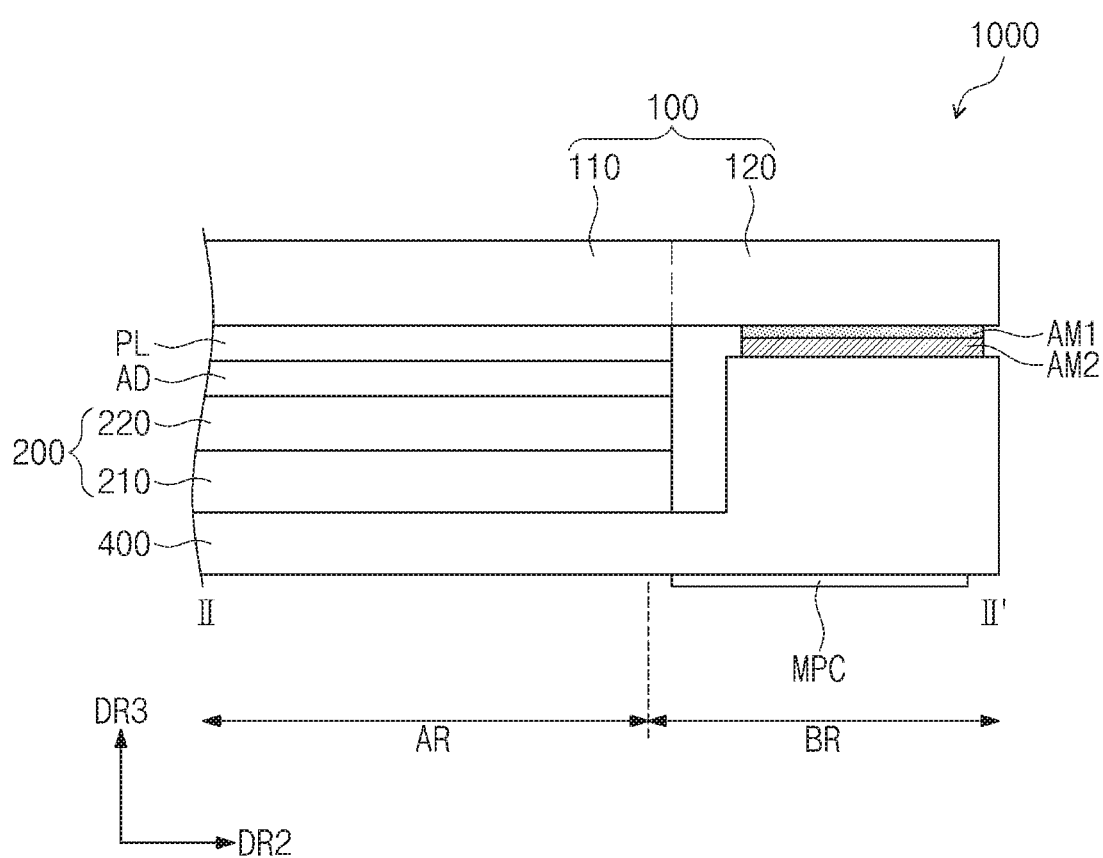
FIG. 8 is a cross-sectional view taken along the line II-II' of FIG. 3 while the display apparatus operates in the first mode.

FIG. 8 is a cross-sectional view taken along the line II-II' of FIG. 3 while the display apparatus operates in the first mode.

Referring to FIG. 8, the display module DPM may further include a first alignment member AM1.

The first alignment member AM1 may be disposed on the rear surface of the peripheral portion 120 of the window member 100.

The first alignment member AM1 may be spaced from the magnetic member 300 along the plane (e.g., along the plane formed by the first and second directions DR1 and DR2). In FIG. 3, it is exemplarily illustrated that the first alignment member AM1 is disposed between short sides of the outer borders EB1 and EB2 of the peripheral portion 120 and the short sides of the effective portion 110.

The first alignment member AM1 may be provided in plurality (e.g., a plurality of the first alignment members AM1 may be provided). In FIG. 3, it is exemplarily illustrated that two of the first alignment members AM1 are provided.

The display apparatus 1000 may further include a second alignment member AM2.

The second alignment member AM2 may be attached on the set bracket 400.

The second alignment member AM2 may be a mark to be aligned with the first alignment member AM1. Thus, the second alignment member AM2 may be disposed to overlap the first alignment member AM1 when viewed in a plane in the first mode. In an embodiment of the present invention, the second alignment member AM2 may be provided in two (e.g., two of the second alignment members AM2 may be provided), which is the same number as the number of the first alignment members AM1.

The first and second alignment members AM1 and AM2 may be configured to align the display module DPM and the set bracket 400. For example, if an impact is applied to the display apparatus 1000 and the display apparatus 1000 enters the second mode, the display module DPM and the set module STM are decoupled from each other. Then, a user aligns the display module DPM and the set module STM to allow the display apparatus 1000 to enter (or reenter) the first mode. The display module DPM and the set module STM may be correctly aligned by using the first and second alignment members AM1 and AM2. Then, the display apparatus 1000 enters the first mode by a user setting, and the display apparatus 1000 may operate normally.

In an embodiment, each of the first and second alignment members AM1 and AM2 may be a printed alignment key (e.g., an alignment mark) but are not limited thereto. In another embodiment, any one of the first and second alignment members AM1 and AM2 may be a protrusion while the other is a groove. For example, in an embodiment in which the first alignment member AM1 is a groove and the second alignment member AM2 is a protrusion, the first alignment member AM1 may be provided on the rear surface of the peripheral portion 120 and the second alignment member AM2 may be accommodated inside the first alignment member AM1 in the first mode.

Figure 9:
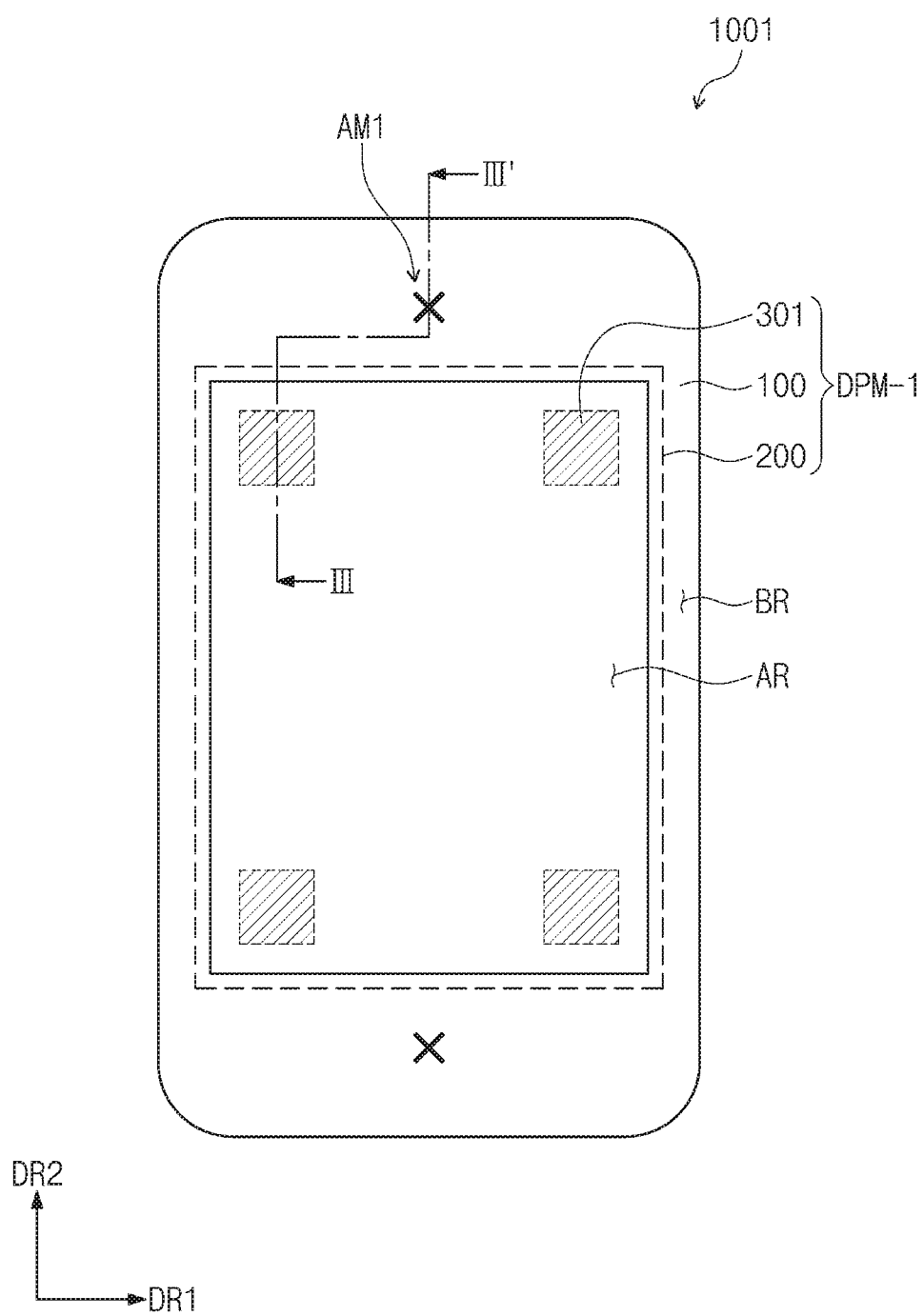
FIG. 9 is a plane view illustrating a display apparatus according to another embodiment of the inventive concept.
Figure 10:
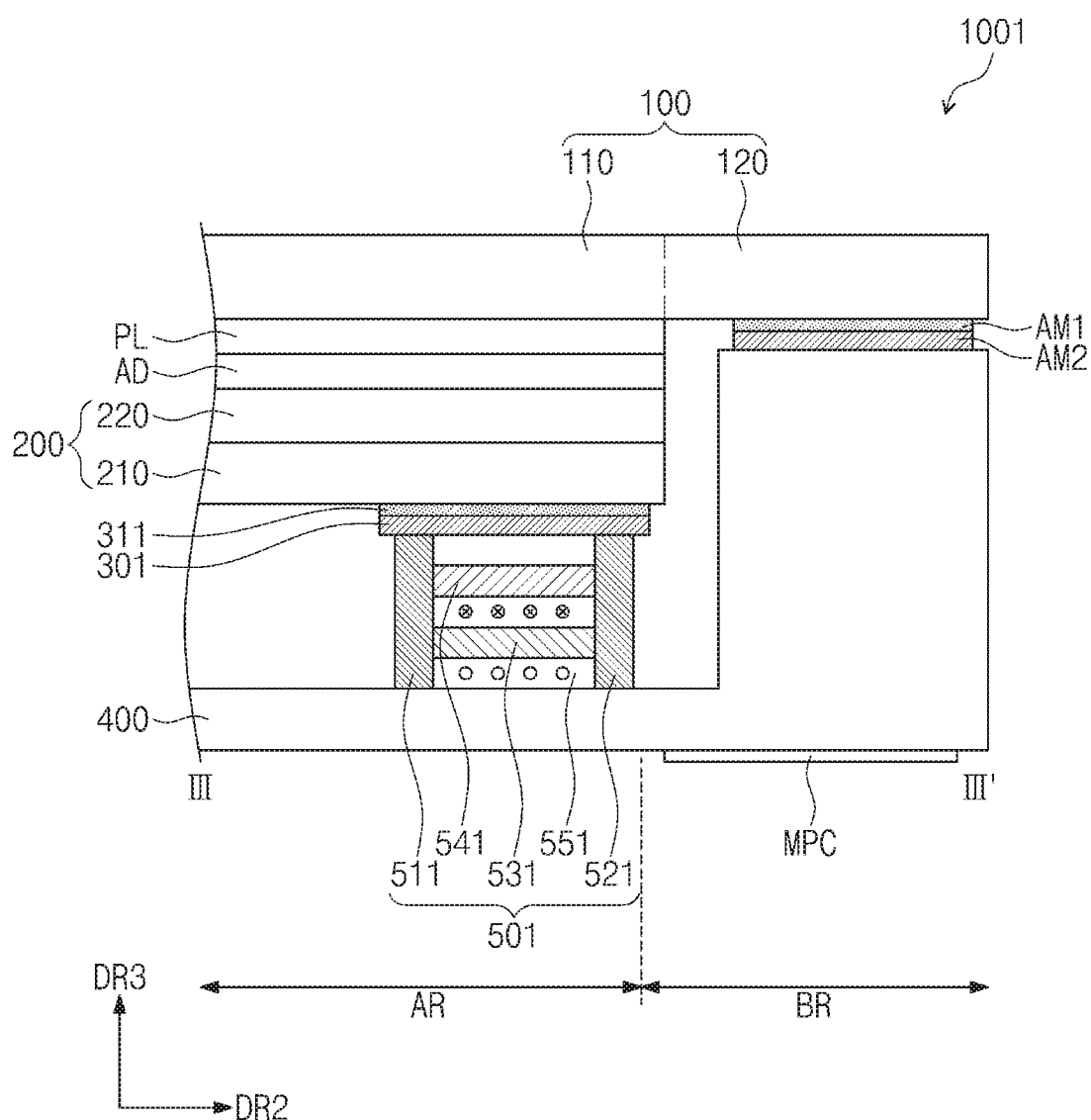
FIG. 10 is a cross-sectional view taken along the line III-III' of FIG. 9 while the display apparatus operates in a first mode.

FIG. 9 is a plane view illustrating a display apparatus according to another embodiment of the inventive concept, and FIG. 10 is a cross-sectional view taken along the line III-III' of FIG. 9 while the display apparatus operates in a first mode.

The display apparatus 1001 illustrated in FIG. 9 differs from the display apparatus 1000 described with reference to FIGS. 1-8 with respect to an electro permanent magnet 501 and a magnetic member 301, while the other elements thereof are the same or substantially the same.

Referring to FIGS. 9 and 10, the magnetic member 301 may be disposed to overlap the effective portion 110 of the window member 100. The magnetic member 301 may be provided in plurality. In FIG. 9, it is exemplarily illustrated that four of the magnetic members 301 are provided and are disposed adjacent to the four corners of the effective portion 110.

The magnetic member 301 may be disposed on the rear surface of the display panel 200. A display module DPM-1 may further include an adhesive layer 311 disposed between the magnetic member 301 and a substrate 210. The adhesive layer 311 may include an optical clear adhesive (OCA) or an optical clear resin (OCR).

The electro permanent magnet 501 may be disposed to face the magnetic member 301. The electro permanent magnet 501 may be disposed to overlap the effective portion 110. The electro permanent magnet 501 may be attached to the set bracket 400.

The electro permanent magnet 501 may include a first magnetic member 511, a second magnetic member 521, a first permanent magnet 531, a second permanent magnet 541, and a solenoid 551. Configuration of the electro permanent magnet 501 is the same or substantially the same as the configuration of the electro permanent magnet 500 described with reference to FIG. 4, and thus, a detailed description thereof may be omitted.

Figure 11:
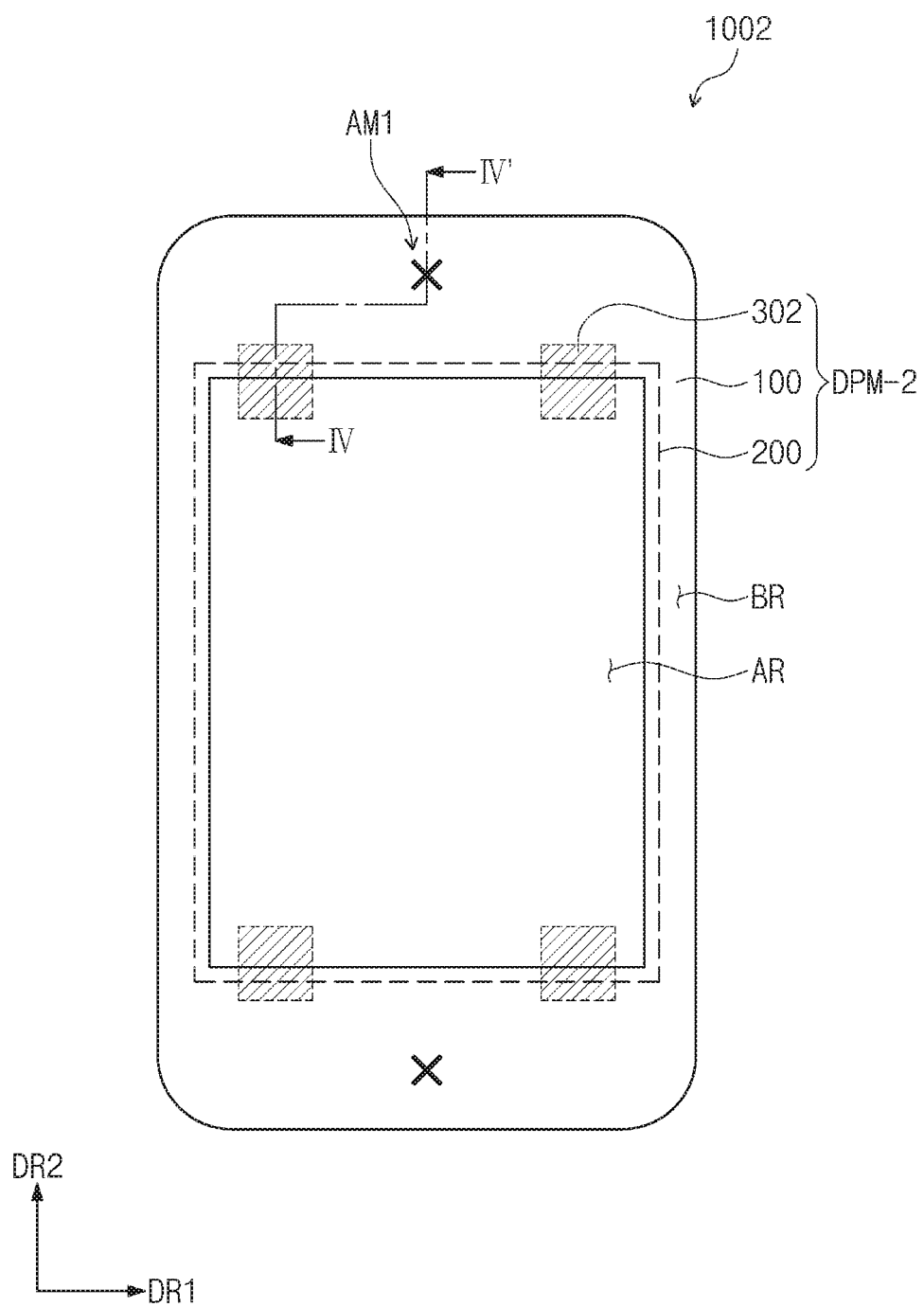
FIG. 11 is a plane view illustrating a display apparatus according to another embodiment of the inventive concept.
Figure 12:
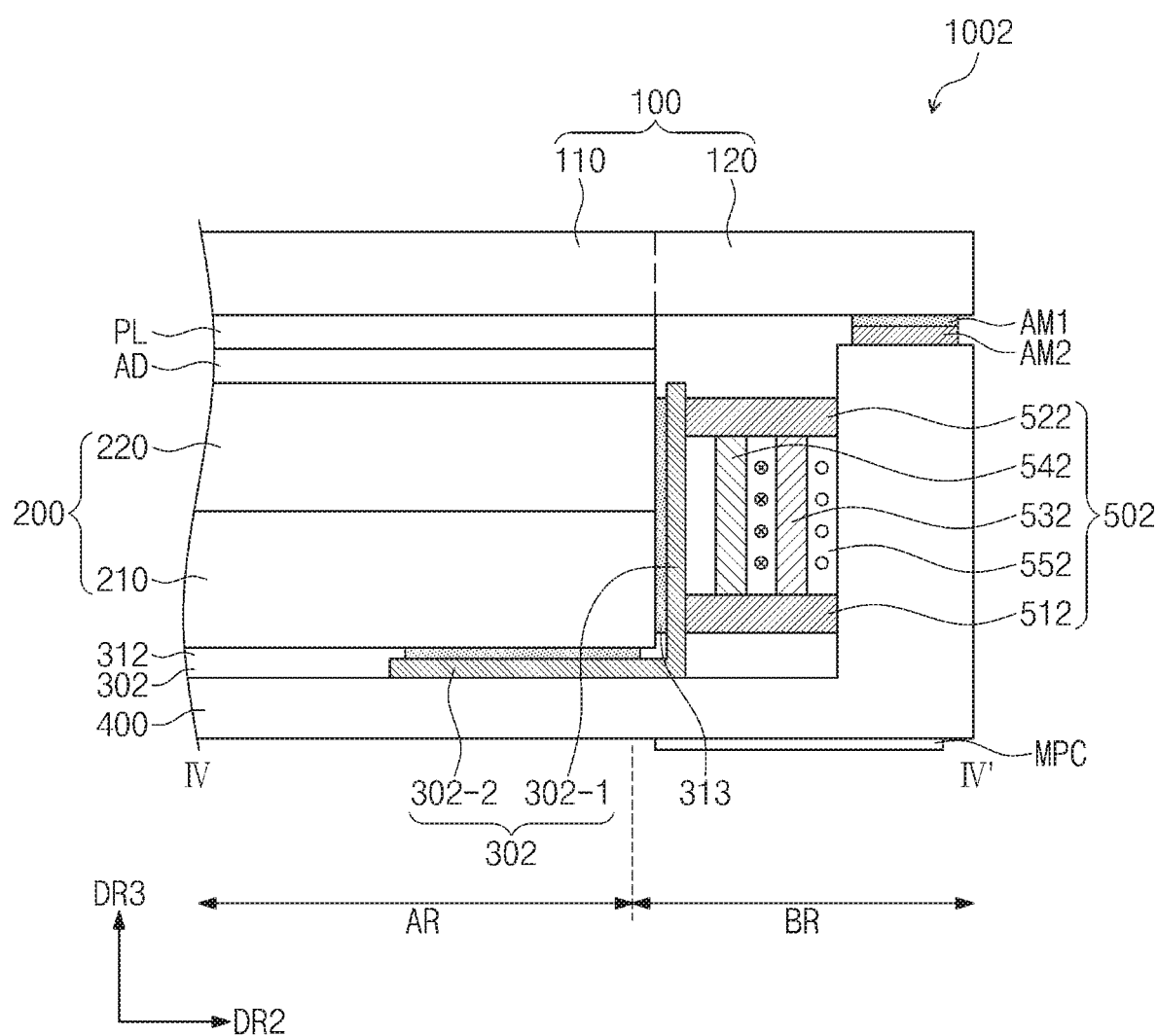
FIG. 12 is a cross-sectional view taken along the line IV-IV' of FIG. 11 while the display apparatus operates in a first mode.

FIG. 11 is a plane view illustrating a display apparatus according to another embodiment of the inventive concept, and FIG. 12 is a cross-sectional view taken along the line IV-IV' of FIG. 11 while the display apparatus operates in a first mode.

The display apparatus 1002 illustrated in FIG. 11 differs from the display apparatus 1000 described with reference to FIGS. 1-8 with respect to an electro permanent magnet 502 and a magnetic member 302, and the other elements thereof are the same or substantially the same.

Referring to FIGS. 11 and 12, the magnetic member 302 may be disposed to overlap the effective portion 110 and the peripheral portion 120 of the window member 100. The magnetic member 302 may be provided in plurality. In FIG. 11, it is exemplarily illustrated that four of the magnetic members 302 are provided and are disposed to overlap the short sides of the effective portion 110 when viewed in the plane.

The magnetic member 302 may include a side magnetic member 302-1 and a rear magnetic member 302-2.

The side magnetic member 302-1 may overlap the peripheral portion 120. The side magnetic member 302-1 may be disposed on a side surface of the display panel 200. A display module DPM-2 may further include a first adhesive layer 313 disposed between the side magnetic member 302-1 and the side surface of the display panel 200.

The rear magnetic member 302-2 may be disposed on the rear surface of the display panel 200. The display module DPM-2 may further include a second adhesive layer 314 disposed between the rear magnetic member 302-2 and the substrate 210.

The side magnetic member 302-1 and the rear magnetic member 302-2 may be connected to each other and, in some embodiments, may be integrally formed.

Because the thickness of the display panel 200 is relatively small (e.g., because the display panel 200 is relatively thin), the side magnetic member 302-1 alone may not be firmly attached to the side surface of the display panel 200. According to an embodiment, the magnetic member 302 of the display apparatus 1002 including the side magnetic member 302-1 and the rear magnetic member 302-2 may be firmly attached to the side and rear surfaces of the display panel 200, respectively.

The electro permanent magnet 502 differs from the electro permanent magnet 500 described with reference to FIG. 4 in that it is rotated by 90 degrees with respect to the electro permanent magnet 500 in FIG. 4. Hereinafter, descriptions may primarily focus on differences between the electro permanent magnet 502 illustrated in FIG. 12 and the electro permanent magnet 500 described with reference with FIG. 4.

The electro permanent magnet 502 may be disposed adjacent to the magnetic member 302 in a second direction DR2. The electro permanent magnet 502 may be disposed to overlap the peripheral portion 120. The electro permanent magnet 502 may be attached to the set bracket 400.

The electro permanent magnet 502 may be attached to the side magnetic member 302-1 in the first mode.

The electro permanent magnet 502 may include a first magnetic member 512, a second magnetic member 522, a first permanent magnet 532, a second permanent magnet 542, and a solenoid 552.

The first and second magnetic members 512 and 522 may be spaced from each other (e.g., spaced apart from each other) along and may be parallel to a plane formed by first and third directions DR1 and DR3. The first and second magnetic members 512 and 522 may extend in (e.g., may have long shapes extending in) the second direction DR2. The first and second magnetic members 512 and 522 may be attached to the side magnetic member 302-1 in the first mode.

The first and second permanent magnets 532 and 542 may be spaced from each other in the second direction DR2.

Figure 13:
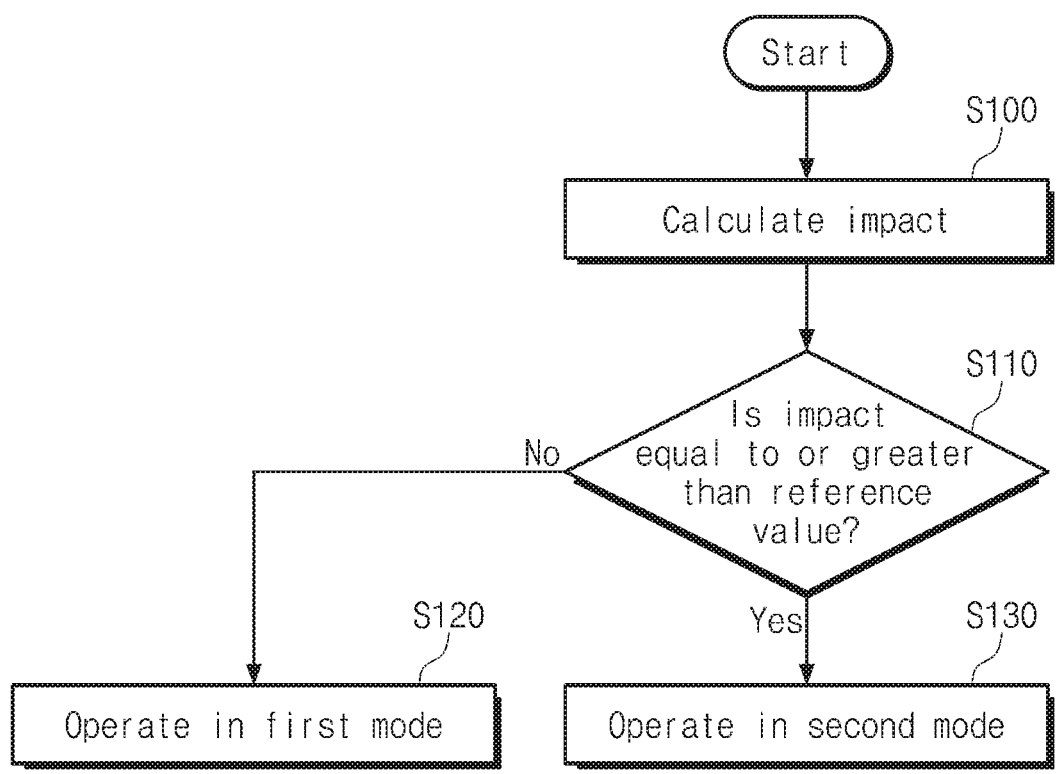
FIG. 13 is a flowchart describing an operating method of the display apparatus according to an embodiment of the inventive concept.

FIG. 13 is a flowchart describing an operating method of the display apparatus according to an embodiment of the inventive concept.

An operating method of the display apparatus 1000 illustrated in FIGS. 1-4 is exemplarily described.

Referring to FIGS. 1-4 and 13, the display apparatus 1000 may fall on the ground or hit a wall such that an impact may occur thereto.

In step S100, if an impact occurs at the display apparatus 1000, the acceleration sensor mounted on the main printed circuit substrate MPC detects the impact. The acceleration sensor calculates the impact delivered to the display apparatus 1000. In step S110, it is determined whether or not the impact delivered to the display apparatus 1000 is equal to or greater than a reference value (e.g., a predetermined value).

If the impact is less than the reference value, the display apparatus 1000 operates in the first mode according to step S120, and the display module DPM and the set module STM are coupled to each other.

If the impact is equal to or greater than the reference value, the display apparatus 1000 operates in the second mode according to step S130, and the display module DPM and the set module STM are decoupled from each other.

If the impact that is equal to or greater than the reference value is delivered to the display apparatus 1000, the display module DPM and the set module STM are decoupled from each other to reduce a shock wave generated by or according to the impact so that the display module DPM may be prevented from being damaged or so that damage to the display module DPM is reduced.

Figure 14:
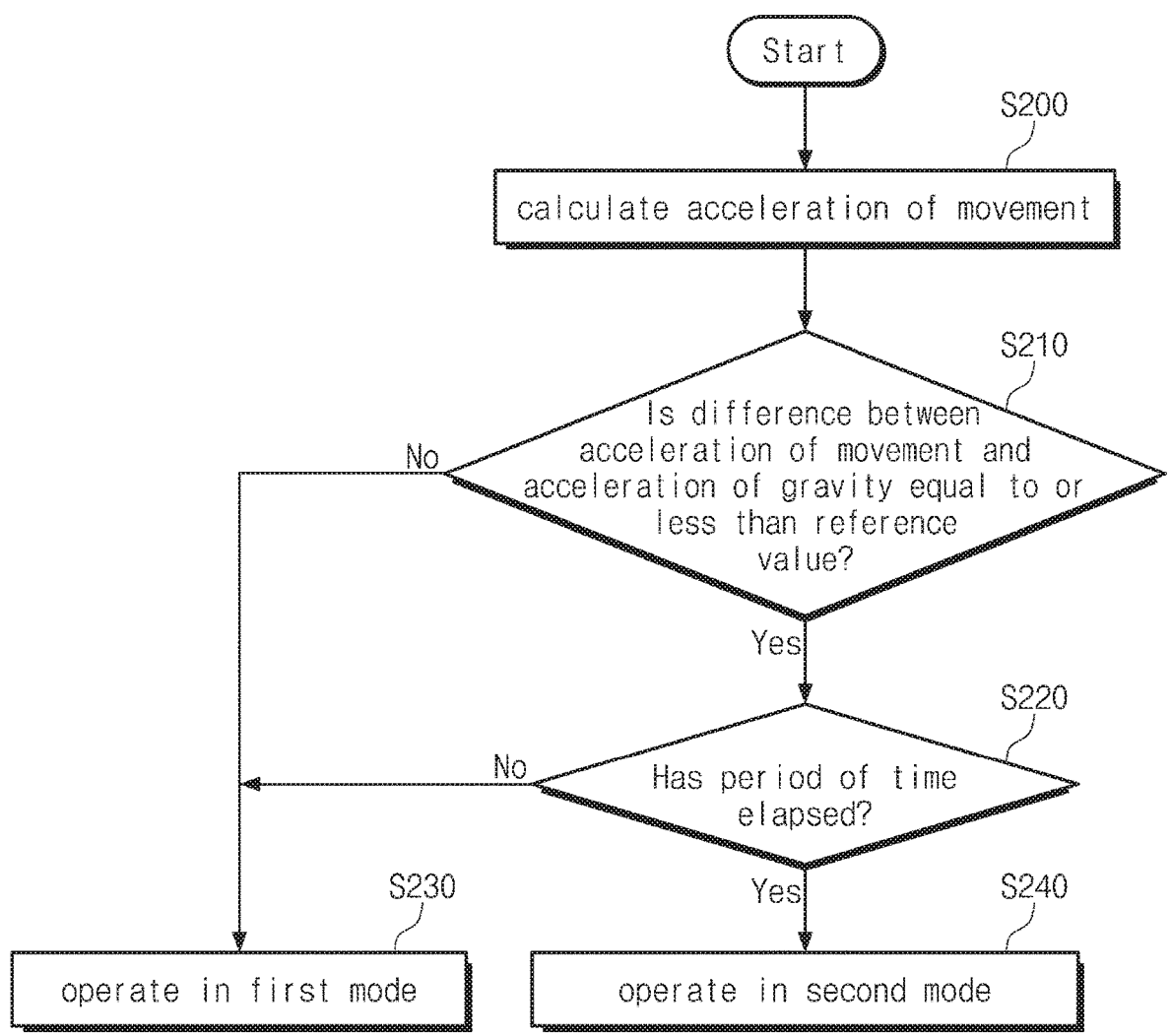
FIG. 14 is a flowchart describing an operating method of the display apparatus according to an embodiment of the inventive concept.

FIG. 14 is a flowchart describing an operating method of the display apparatus according to an embodiment of the inventive concept.

An operating method of the display apparatus 1000 illustrated in FIGS. 1-4 is exemplarily described.

Referring to FIGS. 1-4 and 14, in step S200, if the display apparatus 1000 moves, the acceleration sensor mounted on the main printed circuit substrate MPC measures an acceleration of the movement. In step S210, it is determined whether or not a difference between the acceleration of the movement of the display apparatus 1000 and the acceleration of gravity is equal to or less than a reference value (e.g., a predetermined value).

When the difference between the acceleration of the movement and the acceleration of gravity is greater than the reference value, the display apparatus 1000 is determined not to be falling, and thus, the display apparatus 1000 operates in the first mode according to step S230, and the display module DPM and the set module STM are coupled to each other.

If the difference between the acceleration of the movement and the acceleration of gravity is equal to or less than the reference value, the display apparatus 1000 is determined to be falling, and thus, the method proceeds to step S220.

In the step S220, it is determined whether or not a period of time (e.g., a predetermined time) in which the difference between the acceleration of the movement and the acceleration of gravity is equal to or less than the reference value has elapsed. If the period of time in which the difference between the acceleration of the movement and the acceleration of gravity is equal to or less than the reference value has not elapsed, the display apparatus 1000 operates in the first mode according to step S230. If the period of time in which the difference between the acceleration of the movement and the acceleration of gravity is equal to or less than the reference value has elapsed, the impact which is equal to or greater than the reference value is expected or anticipated to be applied to the display apparatus 1000 and the method proceeds to step S240. In the step S240, the display apparatus 1000 operates in the second mode, and the display module DPM and the set module STM are decoupled from each other.

According to embodiments of the inventive concept, a display apparatus which may be prevented from being damaged due to an external impact or which may experience reduced damage due to the external impact, a mobile terminal including the display apparatus, and an operating method of the display apparatus are provided.

While aspects of the present invention have been particularly shown and described with reference to exemplary embodiments thereof, it will be understood by those of ordinary skilled in the art that various changes may be made therein without departing from the scope of the present invention as defined by the following claims and their equivalents. Therefore, the technical scope of the present invention should not be construed as being limited to the exemplary embodiments described in the description but be considered in view of the appended claims and their equivalents.

What is claimed is:

1. A display apparatus comprising:
 a display module comprising a display panel, a window member adhered to the display panel and having an area greater than an area of the display panel, and a magnetic member attached to at least one of the display panel and the window member;
 a set bracket under the display module; and
 an electro permanent magnet fixed to the set bracket, the electro permanent magnet being coupled to the display module in a first mode and decoupled from the display module in a second mode,
 wherein the display apparatus is configured to enter the second mode from the first mode if an impact equal to or greater than a reference value is applied or is to be applied after a period of time.

2. The display apparatus of claim 1, wherein the electro permanent magnet comprises:
 a first magnetic member;
 a second magnetic member spaced from the first magnetic member;
 a first permanent magnet contacting the first and second magnetic members;
 a second permanent magnet contacting the first and second magnetic members and spaced from the first permanent magnet; and
 a solenoid surrounding the first permanent magnet.

3. The display apparatus of claim 2, wherein each of the first and second magnetic members comprises a magnetic metal alloy, the first permanent magnet comprises an aluminum-nickel-cobalt magnet, and the second permanent magnet comprises a neodymium magnet.

4. The display apparatus of claim 2, further comprising a main printed circuit substrate on a rear surface of the set bracket,
 wherein the main printed circuit substrate is configured to apply a first current to the solenoid in the first mode and to apply a second current having a different direction from the first current to the solenoid in the second mode.

5. The display apparatus of claim 4, wherein the main printed circuit substrate comprises an acceleration sensor configured to calculate an impulse applied to the display apparatus based on acceleration or which is to be applied to the display apparatus after a period of time.

6. The display apparatus of claim 2, wherein: the window member comprises an effective portion overlapping the display panel and a peripheral portion not overlapping the display panel, the magnetic member is on a rear surface of the peripheral portion, and the electro permanent magnet overlaps the peripheral portion and is between the magnetic member and the set bracket.

7. The display apparatus of claim 6, wherein: the effective portion has a rectangular shape when viewed in a plane, the peripheral portion surrounds the effective portion when viewed in the plane, and the magnetic member is between an outer border of the peripheral portion facing a short side of the effective portion and the short side of the effective portion.

8. The display apparatus of claim 6, wherein the first and second magnetic members are attached to the magnetic member in the first mode, and the first and second magnetic members are decoupled from the magnetic member in the second mode.

9. The display apparatus of claim 6, wherein the display module further comprises: a first alignment member on the rear surface of the peripheral portion and spaced from the magnetic member; and a second alignment member that is arranged with the first alignment member in the first mode.

10. The display apparatus of claim 1, wherein the magnetic member is on a rear surface of the display panel, and the electro permanent magnet is between the magnetic member and the set bracket.

11. The display apparatus of claim 1, wherein: the window member comprises an effective portion overlapping the display panel and a peripheral portion not overlapping the display panel, the magnetic member comprises a side magnetic member on a side surface of the display panel and a rear magnetic member on a rear surface of the display panel, and the electro permanent magnet overlaps the peripheral portion and is between the side magnetic member and the set bracket.

12. The display apparatus of claim 11, wherein the side magnetic member and the rear magnetic member are integrally formed.

13. A portable terminal comprising:
 a display module comprising:
  a display panel;
  a window member adhered to the display panel and having an area greater than an area of the display panel; and
  a magnetic member attached to at least one of the display panel and the window member; and
 a set module configured to be coupled to the display module in a first mode and to be decoupled from the display module in a second mode, the set module comprising:
  a set bracket on a lower portion of the display module;
  an electro permanent magnet coupled to the magnetic member in the first mode and decoupled from the magnetic member in the second mode; and a main printed circuit substrate on a rear surface of the set bracket and electrically connected to the display module, wherein the portable terminal is configured to enter the second mode from the first mode if an impact equal to or greater than a reference value is applied to the portable terminal or is to be applied to the portable terminal after a period of time.

14. The portable terminal of claim 13, wherein the main printed circuit substrate comprises an acceleration sensor configured to calculate the impact applied to the portable terminal or to be applied to the portable terminal after a period of time based on acceleration.

15. A method of operating a display apparatus, the display apparatus comprising: a display module comprising a display panel, a window member adhered to the display panel, and a magnetic member attached to at least one of the display panel and the window member; a set module comprising a set bracket; an electro permanent magnet fixed to the set bracket; and a main printed circuit substrate on a rear surface of the set bracket and electrically connected to the display panel, the method comprising:

calculating an impact applied to the display apparatus;

determining whether or not the impact applied to the display apparatus is equal to or greater than a reference value; and if the impact applied to the display apparatus is determined to be equal to or greater than the reference value, changing an operating mode of the display apparatus from a first mode to a second mode, wherein, in the second mode, the display panel and the set module are decoupled from each other.

16. The method of claim 15, wherein, if the impact applied to the display apparatus is determined to be less than the reference value, the display apparatus operates in the first mode, and wherein, in the first mode, the display module and the set module are coupled to each other.

17. The method of claim 15, wherein the main printed circuit substrate comprises an acceleration sensor, and the calculating the impact applied to the display apparatus is performed by the acceleration sensor.

18. A method of operating a display apparatus, the display apparatus comprising: a display module comprising a display panel, a window member adhered to the display panel, and a magnetic member attached to at least one of the display panel and the window member; a set module comprising a set bracket; an electro permanent magnet fixed to the set bracket; and a main printed circuit substrate on a rear surface of the set bracket and electrically connected to the display panel, the method comprising:

calculating an acceleration of movement of the display apparatus;

determining whether or not the acceleration of the movement of the display apparatus is equal to or less than a reference value; and determining whether or not a period of time has elapsed when a difference between the acceleration of the movement and an acceleration of gravity of the display apparatus is equal to or less then the reference value, wherein, if the difference between the acceleration of the movement and the acceleration of gravity of the display apparatus has been equal to or less than the reference value for the period of time, the display apparatus operates in a second mode in which the display panel and the set module of the display apparatus are decoupled from each other.

19. The method of operating the display apparatus of claim 18, wherein, when the difference between the acceleration of the movement and the acceleration of gravity is greater than the reference value, or when the difference between the acceleration of the movement and the acceleration of gravity of the display apparatus has been equal to or less than the reference value for less than the period of time, the display apparatus operates in a first mode in which the display module and the set module are coupled to each other.

20. The method of operating the display apparatus of claim 18, wherein the calculating the acceleration of the movement is performed by an acceleration sensor of the display apparatus.

21. A display apparatus comprising:

a display module comprising a display panel configured to display an image and a window member adhered to the display panel;

a set bracket under the display module; and a magnetic member and an electro permanent magnet configured to be selectively coupled and decoupled from each other, one of the magnetic member and the electro permanent magnet being coupled to the window member and the other of the magnetic member and the electro permanent magnet being coupled to the set bracket.

22. The display apparatus of claim 21, further comprising an acceleration sensor configured to measure acceleration of the display apparatus, wherein, if the acceleration of the display apparatus is measured to be equal to or greater than a reference value, the magnetic member and the electro permanent magnet are decoupled from each other.

23. The display apparatus of claim 22, wherein the electro permanent magnet comprises a solenoid, and wherein, if the acceleration of the display apparatus is measured to be equal to or greater than a reference value, a first current is applied to the solenoid such that the magnetic member and the electro permanent magnet are decoupled from each other.

24. The display apparatus of claim 21, further comprising a plurality of the magnetic members and a corresponding plurality of the electro permanent magnets, and wherein ones of the magnetic members are at corners of the display panel and ones of the electro permanent magnets are respectively at the corners of the display panel.

25. The display apparatus of claim 24, wherein the set bracket is under the display module in a first direction, wherein the magnetic member and the electro permanent magnet are adjacent to each other in the first direction, and wherein the electro permanent magnet overlaps the display panel in the first direction and is adjacent to the display panel is a second direction that is perpendicular to the first direction.

* * * * *